(12) United States Patent
Porter et al.

(10) Patent No.: US 10,207,208 B2
(45) Date of Patent: Feb. 19, 2019

(54) AUTONOMOUS FILTRATION SWITCH

(71) Applicant: International Business Machines Corporation, Armonk, NY (US)

(72) Inventors: Donald W. Porter, Highland, NY (US); Jacob T. Porter, Highland, NY (US); Allan C. VanDeventer, Poughkeepsie, NY (US); Jason T. Wertz, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/356,970

(22) Filed: Nov. 21, 2016

(65) Prior Publication Data

US 2018/0140976 A1    May 24, 2018

(51) Int. Cl.
| | | |
|---|---|---|
| *B01D 29/52* | (2006.01) | |
| *H05K 7/20* | (2006.01) | |
| *B01D 29/60* | (2006.01) | |
| *B01D 29/56* | (2006.01) | |
| *B01D 29/31* | (2006.01) | |
| *B01D 35/147* | (2006.01) | |

(52) U.S. Cl.
CPC ........... *B01D 29/606* (2013.01); *B01D 29/31* (2013.01); *B01D 29/52* (2013.01); *B01D 29/56* (2013.01); *B01D 35/1475* (2013.01); *H05K 7/20272* (2013.01); *H05K 7/20763* (2013.01); *B01D 2201/188* (2013.01); *B01D 2201/54* (2013.01)

(58) Field of Classification Search
CPC ................ B01D 29/52; B01D 35/1475; B01D 2201/188
See application file for complete search history.

(56) References Cited

U.S. PATENT DOCUMENTS

| | | | | |
|---|---|---|---|---|
| 1,592,835 | A | * | 7/1926 | Mock ................... B01D 35/005 137/383 |
| 2,979,160 | A | | 4/1961 | Haas |
| 3,914,176 | A | | 10/1975 | Holmes |

(Continued)

FOREIGN PATENT DOCUMENTS

CN        203525418 U    4/2014

OTHER PUBLICATIONS

Porter et al., "Autonomous Filtration Switch", U.S. Appl. No. 15/416,479, filed Jan. 26, 2017, 33 pages.

(Continued)

*Primary Examiner* — Terry K Cecil
(74) *Attorney, Agent, or Firm* — Tihon Poltavets

(57) ABSTRACT

An apparatus for a switchable filter assembly includes a first conduit coupled to a second and a third conduit, where a liquid has the ability to flow through the first conduit to the second conduit and the third conduit, and where the second conduit and the third conduit are arranged in parallel. A first assembly is capable of sliding inside the first conduit, such that a position of the first assembly determines an amount of liquid flowing to the third conduit. The first assembly includes a compressible member coupled to a first structure, where the first structure prevents the liquid from passing through the first conduit to the third conduit. An amount of compression of the compressible member coupled to the first structure is dependent on a pressure of the liquid flowing from the first conduit to the second conduit.

5 Claims, 5 Drawing Sheets

(56) References Cited

U.S. PATENT DOCUMENTS

| | | |
|---|---|---|
| 3,983,899 A | 10/1976 | Graham et al. |
| 4,033,870 A | 7/1977 | Parquet et al. |
| 4,615,800 A | 10/1986 | Stifelman et al. |
| 5,298,158 A | 3/1994 | Anderson |
| 5,531,800 A | 7/1996 | Sewell et al. |
| 5,681,454 A | 10/1997 | Schenk |
| 6,474,289 B1 | 11/2002 | Lilly et al. |
| 7,183,863 B1 * | 2/2007 | Bedrosian ............... H03L 7/085 327/156 |
| 7,570,058 B1 | 8/2009 | Wong et al. |
| 8,110,114 B2 | 2/2012 | Keenan |
| 8,647,516 B2 | 2/2014 | Love |
| 8,673,136 B2 | 3/2014 | Guess |
| 2011/0048548 A1 | 3/2011 | Rahm |
| 2012/0234770 A1 | 9/2012 | Goodwin |
| 2014/0061140 A1 * | 3/2014 | Bailey ...................... B07B 1/46 210/780 |

OTHER PUBLICATIONS

IBM, Appendix P, List of IBM Patents or Patent Applications Treated as Related, dated Jun. 8, 2017, 2 pages.

Made-In_China.com "China Lgfg-II Double Barrel Switchable Filter Backwash—China Filter". WayBack Machine Aug. 8, 2014. <http://web.archive.org/web/*/http://lilyman.en.made-in-china.com/product/jXvmsCfyMTVh/China-Lgfg-II-Double-Barrel-Switchable-Filter-Backwash.html>.

* cited by examiner

AUTONOMOUS FILTRATION SWITCH

FIELD OF THE INVENTION

This disclosure relates generally to cooling systems in a processor drawer, and in particular, to filtration systems included in the cooling systems.

BACKGROUND OF THE INVENTION

In some data centers, certain computer systems have migrated to water-cooling solutions to effectively remove heat load from the processor drawer containing electronic components. With the varying designs for cooling of the processors drawer, reliability takes priority to prevent failure of electrical components due to excessive heat load. Additionally, reliability takes priority to prevent down time to service either the electronic components or the cooling system for the electronic components. One aspect of reliability pertains to the filtering of debris out of the cooling system to avoid debris coming in contact with cooling plates in the cooling system.

SUMMARY

One aspect of an embodiment of the present invention discloses an apparatus for a switchable filter assembly comprising, a first conduit coupled to a second and a third conduit, wherein a liquid has the ability to flow through the first conduit to the second conduit and the third conduit, wherein the second conduit and the third conduit are arranged in parallel; a first assembly capable of sliding inside the first conduit, such that a position of the first assembly determines an amount of liquid flowing to the third conduit; the first assembly includes a compressible member coupled to a first structure, wherein the first structure prevents the liquid from passing through the first conduit to the third conduit; and wherein an amount of compression of the compressible member coupled to the first structure is dependent on a pressure of the liquid flowing from the first conduit to the second conduit.

A second aspect of an embodiment of the present invention discloses a method for managing liquid flow through a filter assembly, the method comprising, determining, by one or more processors, liquid pressure at a first filter in a filter assembly; responsive to determining the liquid pressure at the first filter is over a threshold value, sending, by one or more processors, a notification to a client device, wherein the notification includes a liquid pressure over threshold warning; and opening, by one or more processors, a valve in the filter assembly, wherein the valve controls liquid flow to a second filter.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

DETAILED DESCRIPTION

Detailed embodiments of the present invention are disclosed herein with reference to the accompanying drawings; however, it is to be understood that the disclosed embodiments are merely illustrative of potential embodiments of the invention and may take various forms. In addition, each of the examples given in connection with the various embodiments is also intended to be illustrative, and not restrictive. This description is intended to be interpreted merely as a representative basis for teaching one skilled in the art to variously employ the various aspects of the present disclosure. In the description, details of well-known features and techniques may be omitted to avoid unnecessarily obscuring the presented embodiments.

Figure 1:
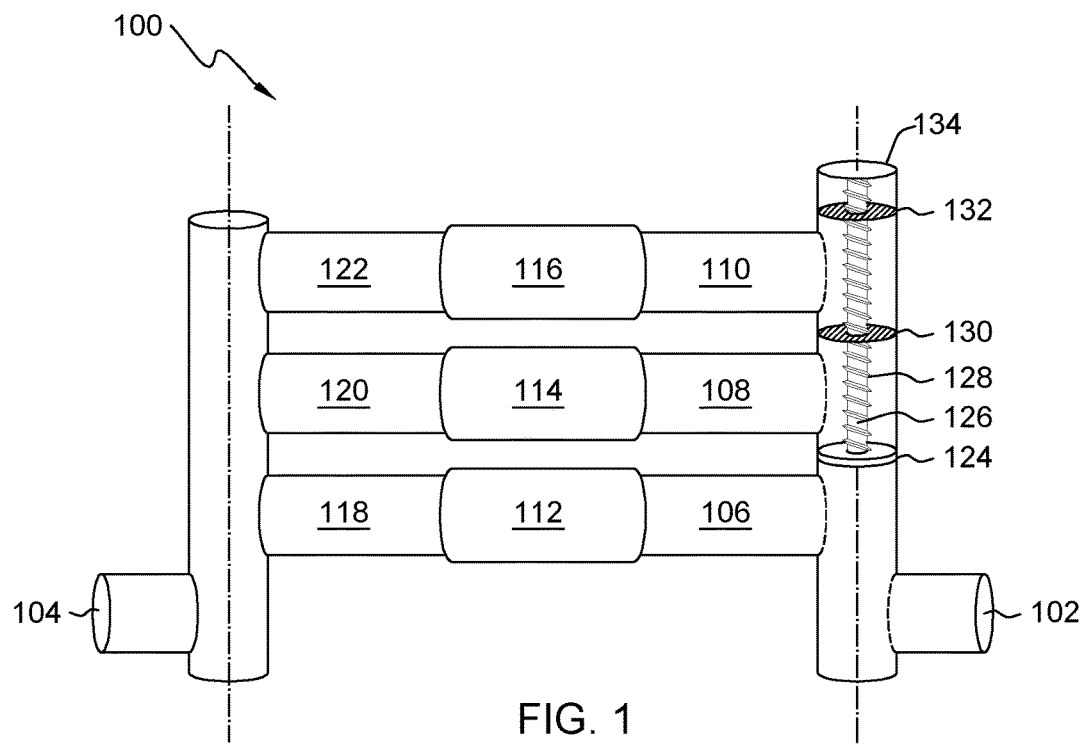
FIG. 1 depicts a spring based filter switch assembly, in accordance with an embodiment of the present invention.

FIG. 1 depicts a spring based filter switch assembly, in accordance with an embodiment of the present invention. In this embodiment, filter assembly 100 utilizes particle filters 112, 114, and 116, arranged in parallel, for processing liquid in a cooling system. In another embodiment, filter assembly 100 utilizes particle filter 114 arranged in series with particle filter 116, where particle filter 112 is arranged in parallel with respect to particle filter 114 and 116. Particle filters 112, 114, and 116 can be arranged in any manner, where liquid can be directed to a particular particle filter through the use of rod assembly 134. Filter assembly 100 includes inlet 102 and outlet 104, where liquid entering inlet 102 (i.e., conduit) is unfiltered and liquid exiting outlet 104 is filtered.

Prior to liquid entering the cooling system through outlet 104, the liquid enters inlet 102 in filter assembly 100 and flows through section 106 (i.e., conduit) towards particle filter 112. Particle filter 112 processes the liquid and releases the liquid through section 118 and exits outlet 104. Particle filters 114 and 116 process the liquid and release the liquid through sections 120 and 122, respectively. Piston assembly 134 includes plate 124 and spring 128, where plate 124 creates a seal preventing liquid from flowing through section 108 and 110 to filter 114 and 116, respectively. Piston assembly 134 represents a structure that includes rod 126, where rod 126 provides structural support for spring 128. In this embodiment, rod 126 includes multiple collapsible portions, where the multiple collapsible portions include varying diameter rods. As piston assembly 134 with plate 124 travels in an upward motion, the length of rod 126 decreases with the compression of the multiple collapsible portions of rod 126. In another embodiment, filter assembly 100 can utilize lockable spring valves, where an operation of the lockable spring valve is pressure dependent. The number of lockable spring valves and the pressure threshold for each lockable spring valve is based on the configuration of the particle filters (i.e., particle filters 112, 114, and 116) of filter assembly 100.

Piston assembly 134 has the ability to move through the cylinder depending on the amount of pressure exerted on the bottom plane of plate 124. As the pressure exerted on the bottom plane of plate 124 increases, spring 128 compresses and plate moves along the vertical axis (i.e., latitudinal) of rod 126. A spring rate for spring 128 correlates to the forces exerted by a liquid on the bottom plane of plate 124. In this embodiment, pressure on the bottom plane of plate 124 varies depending on a volumetric flow rate of liquid through particle filter 112. For example, if the volumetric flow rate of liquid at inlet 102 decreases due to increasing impedance of particle filter 112, the pressure on the bottom plane of plate 124 will increase. As the pressure increases above a certain threshold, spring 128 compresses and allows for plate 124 to move upward in the cylinder, while maintaining the seal preventing liquid from flowing past plate 124 and resulting in liquid flow to particle filter 114.

Impeded flow through particle filter 112 results in the compression of piston assembly 128, where plate 124 slides in an upward motion to position 130. At position 130, the liquid flows through section 106 towards particle filter 112 and through section 108 (i.e., conduit) towards particle filter 114. Additionally, impeded flow through both particle filters 112 and 114 results in further compression of piston assembly 128, where plate 124 slides in an upward motion from position 130 to position 132. At position 132, the liquid flows through section 110 towards filter 116, and through section 106 and 108 towards filter 112 and 114, respectively. In this embodiment, as pressure builds on the bottom plane of plate 124, piston assembly 128 allows for trickle flow of liquid into section 108 and 110, depending on a position of plate 124. In another embodiment, piston assembly 128 utilizes spring 128, where spring 128 includes a varying spring rate. The varying spring rate allows for a reduction in trickle flow of liquid into section 108 and 110, depending on a position of plate 124.

Filter assembly 100 can utilize a warning indicator on piston assembly 134, where the warning indicator on piston assembly 134 displays when liquid flow is directed towards filter 114 and 116. The warning indicator can include a display window at position 130 and 132 on filter assembler 100, where a user servicing filter assembly 100 can view whether piston assembly 134 is located at position 130 or position 132. In the event the user views that piston assembly 134 is located at position 130, filter 112 is impeding liquid flow and an obstruction exists in filter 112. In the event the user views that piston assembly is located at position 132, filter 112 and 114 is impeding liquid flow and an obstruction exists in both filter 112 and 114.

In this embodiment, particle filter 112, 114, and 116 utilize the same size mesh filter to process the liquid flowing through filter assembly 100. In another embodiment, particle filter 112, 114, and 116 vary in mesh filter sizes to allow for piston assembly 134 to direct liquid flow to a particular filter (e.g., particle filter 114 and 116) to trap varying sizes of debris. In one example, particle filter 112 utilizes a smaller mesh filter size than particle filter 114 and particle filter 114 utilizes a smaller mesh filter size than particle filter 116. As liquid flow is impeded due to an obstruction in particle filter 112, piston assembly 134 directs liquid towards particle filter 114 with a larger mesh filter size to process the liquid. Additionally, as liquid flow is impeded due to an obstruction in particle filter 114, piston assembly 134 directs liquid towards particle filter 116 with a mesh filter larger in size compared to particle filter 112 and 114 to process the liquid. In another embodiment, mesh filter size may vary across particle filter 112, 114, and 116, where for example, particle filter 114 has a larger mesh filter size than particle filter 112 and 116. Additionally, a type of chemical treatment introduced may vary across particle filter 112, 114, and 116.

In another embodiment, filter assembly 100 utilizes particle filter 112, 114, and 116, where particle filter 114 introduces a first chemical treatment into the liquid and particle filter 116 introduces a second chemical treatment into the liquid. The first and second chemical treatment can, for example, act as an agent to prevent obstruction at particle filter 114 and 116, respectively. The first and second chemical treatment can also, for example, act as an agent to prevent corrosion of the cooling system, once the liquid with the first and second chemical treatment enters the cooling system through outlet 104.

Figure 2:
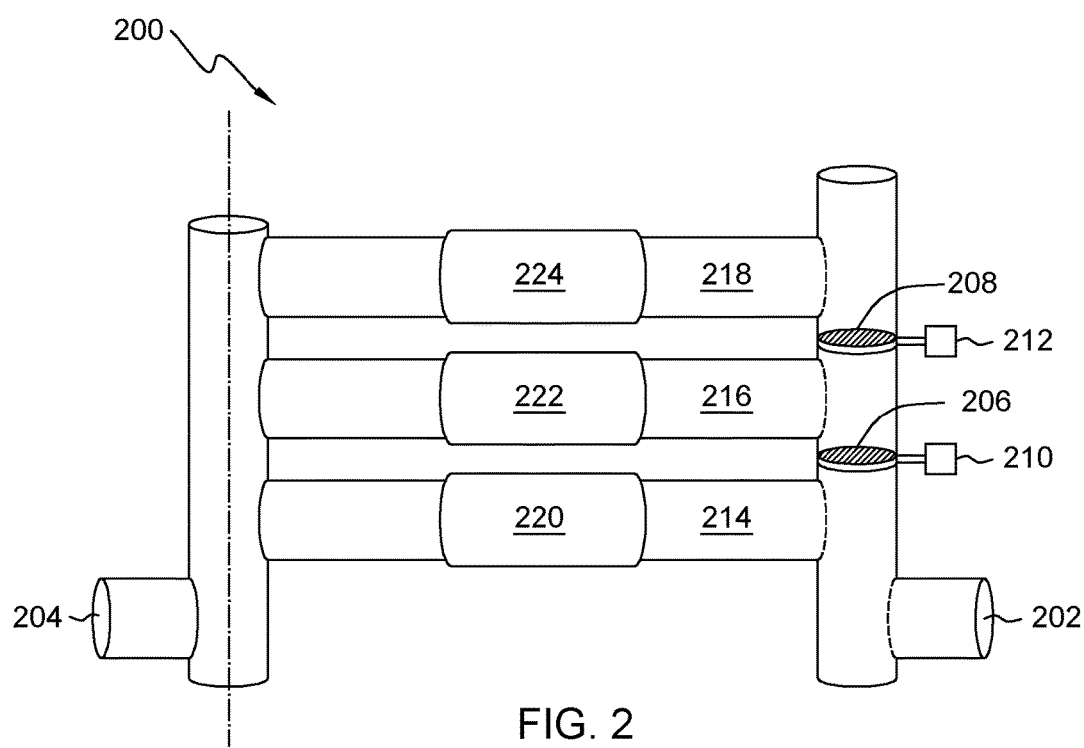
FIG. 2 depicts a valve based filter switch assembly, in accordance with one embodiment of the present invention.

FIG. 2 depicts a valve based filter switch assembly, in accordance with one embodiment of the present invention. In this embodiment, filter assembly 200 utilizes particle filters 220, 222, and 224, arranged in parallel, for processing liquid in a cooling system. In another embodiment, filter assembly 200 utilizes particle filter 222 arranged in series with particle filter 224, where particle filter 220 is arranged in parallel with respect to particle filter 222 and 224. Particle filters 220, 222, and 224 can be arranged in any manner, where liquid can be directed to a particular particle filter through the use of valve 206 and 208. Filter assembly 200 includes inlet 202 and outlet 204, where liquid entering inlet 202 is unfiltered and liquid exiting outlet 204 is filtered.

Prior to liquid entering the cooling system through outlet 204, the liquid enters inlet 202 in filter assembly 200 and flows through section 214 towards particle filter 220. Particle filter 220 processes the liquid, releases the liquid and the liquid exits outlet 204. Valve 206 and 208 include motors 210 and 212, respectively, wherein a combination of valve 206 and motor 210, along with valve 208 and motor 212, represent structures. Valve 206 creates a seal preventing liquid from flowing through section 216 and 218 to filter 222 and 224, respectively. Sensor drive motor 210 has the ability to determine a pressure exerted on valve 206, where if the pressure (e.g., 15 N/m$^2$) exerted on valve 206 exceeds a pressure threshold (e.g., 10 N/m$^2$), motor 210 opens valve 206.

In this embodiment, pressure on the bottom plane of valve 206 varies depending on a volumetric flow rate of liquid through particle filter 220. For example, if the volumetric flow rate of liquid at inlet 202 decreases due to increasing impedance of particle filter 220, the pressure on the bottom plane of valve 206 will increase. As the pressure increases above a certain threshold, motor 210 opens valve 206 resulting in liquid flow to particle filter 222. In another embodiment, valve 206 and valve 208 can represent solenoid valves or any valves known in the art.

Motor 210 and motor 212 can open valve 206 and valve 208, respectively, on a time-based schedule. In an example, particle filter 220 differs from particle filter 222 and 224, and particle filter 222 differs from particular filter 224. For a first portion of the year motor 210 prevents valve 206 from opening, which allows for the liquid to flow through particle filter 220, where particle filter 220 introduces a first chemical treatment into the liquid. For a second portion of the year motor 210 opens valve 206 to allow liquid to flow through particle filter 222, where particle filter 222 introduces a second chemical treatment into the liquid. Finally, for a third portion of the year, motors 210 opens valve 206 and motor 212 opens valve 208 to allow liquid to flow through both, particle filter 222 and particle filter 224. The opening of valve 206 and valve 208 via motor 210 and motor 212, respectively, is based on user-defined preference for filter assembly 200. The user-defined preferences can specify a time scale for when liquid is allowed to flow through particle filter 222 and particle filter 224 and can include but is not limited to a monthly or yearly time scale.

Impeded liquid flow through particle filter 220 results in motor 210 opening valve 206 to allow liquid flow to section 216, towards filter 222. As liquid flows towards section 216, valve 208 prevents liquid flow towards section 218 by creates a seal preventing liquid from flowing through section 218 to 224. Additionally, impeded flow through both particle filters 220 and 222 results in motor 212 opening valve 208 to allow liquid flow to section 218 to filter 224. In this embodiment, a pressure threshold for valve 206 is the same as a pressure threshold for valve 208. In another embodiment, a pressure threshold for valve 208 is greater than a pressure threshold for valve 206, due to valve 208 providing a path to a final filter with no obstruction impeding flow towards outlet 204. Filter assembly 200 can utilize filter management program 510 to send pressure over threshold warnings to a user servicing filter assembly 200. Operational details of filter management program 510 are discussed in further detail with regards to FIG. 6.

In this embodiment, particle filter 220, 222, and 224 utilizes the same size mesh filter to process the liquid flowing through filter assembly 200. In another embodiment, particle filter 220, 222, and 224 vary in mesh filter sizes to allow for valve 206 and 208 to direct liquid flow to a particular filter (e.g., particle filter 222 and 224) to trap varying sizes of debris. In one example, particle filter 220 utilizes a smaller mesh filter size than particle filter 222 and particle filter 222 utilizes a smaller mesh filter size than particle filter 224. As liquid flow is impeded due to an obstruction in particle filter 220, valve 206 directs liquid towards particle filter 222 with a larger mesh filter size to process the liquid. Additionally, as liquid flow is impeded due to an obstruction in particle filter 222, valve 208 directs liquid towards particle filter 224 with a mesh filter larger in size compared to particle filter 220 and 222 to process the liquid. In another embodiment, mesh filter size may vary across particle filter 220, 222, and 224, where for example, particle filter 222 has a larger mesh filter size than particle filter 220 and 224. Additionally, a type of chemical treatment introduced may vary across particle filter 220, 222, and 224.

In another embodiment, filter assembly 200 utilizes particle filter 220, 222, and 224, where particle filter 222 introduces a first chemical treatment into the liquid and particle filter 224 introduces a second chemical treatment into the liquid. The first and second chemical treatment can, for example, act as an agent to prevent obstruction at particle filter 222 and 224, respectively. The first and second chemical treatment can also, for example, act as an agent to prevent corrosion of the cooling system, once the liquid with the first and second chemical treatment enters the cooling system through outlet 204.

Figure 3:
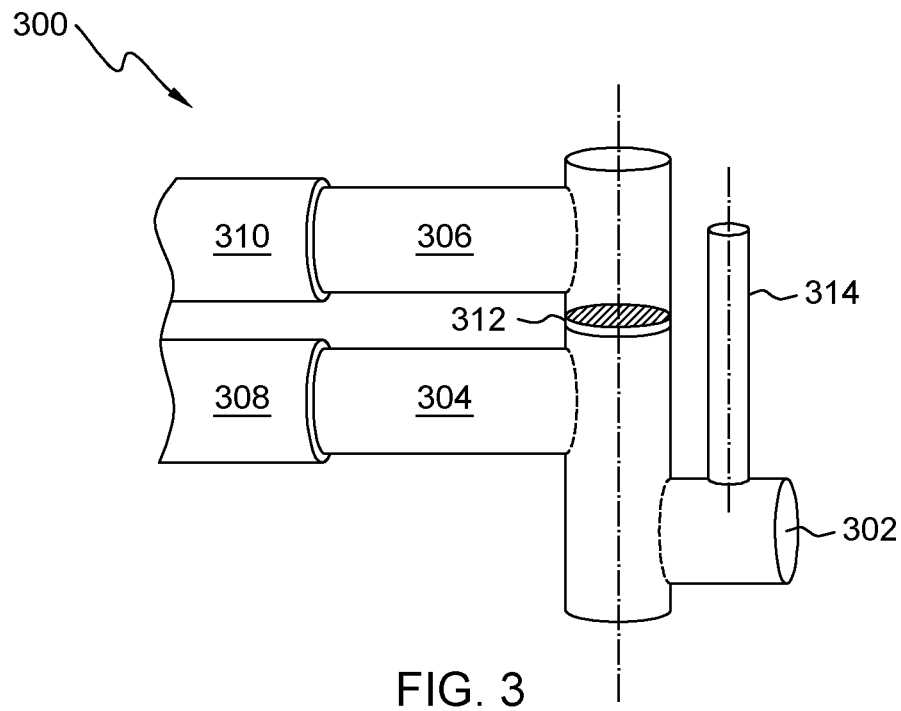
FIG. 3 depicts a pressure damper for a filter switch assembly, in accordance with one embodiment of the present invention.

FIG. 3 depicts a pressure damper for a filter switch assembly, in accordance with one embodiment of the present invention. In this embodiment, filter assembly 300 utilizes particle filter 308 and 310, where liquid entering filter assembly 300 through inlet 302 is directed towards section 304 or section 306 depending on the position of valve 312. Filter assembly 300 also utilizes damper 314 for preventing pressure spikes due to water hammer, which can trigger valve 312 to open prematurely. Because the position of valve 312 is dependent on water pressure, damper 314 prevents valve 312 from prematurely opening due to liquid pressure spikes not related to impeded liquid flow through filter 308. In another embodiment, filter assembly 300 utilizes damper 314, where filter assembly utilizes a piston assembly for directing liquid flow to filter 310.

Figure 4:
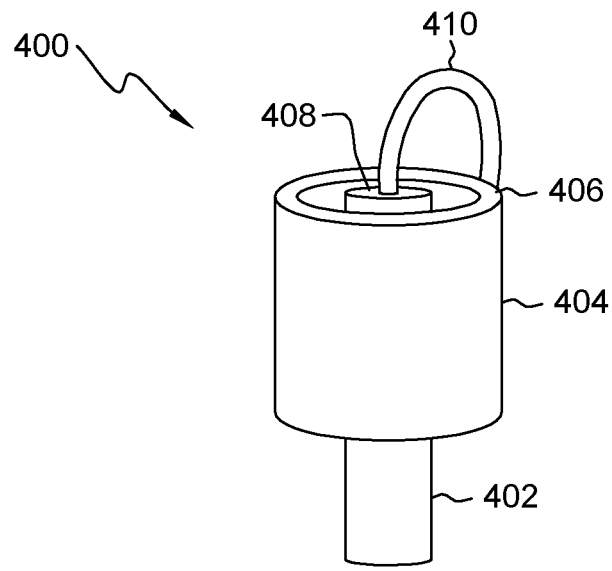
FIG. 4 depicts a lockable valve for the valve based filter switch assembly of FIG. 2.

FIG. 4 depicts a lockable valve for the valve based filter switch assembly of FIG. 2. In this embodiment, lockable valve 400 utilizes a two-cylinder valve device with inner cylinder 402 and outer cylinder 404. Lockable valve 400 utilizes lock mechanism 410 connected at point 408, where point 408 is located on inner cylinder 402. Lock mechanism 410 allows for lockable valve 400 to remain in an open position once activated to allow liquid flow to another filter in a filter assembly. A bottom portion of lock mechanism 410 springs in an inward motion past point 406 to prevent lockable valve 400 from closing and impeding liquid flow. Further, the bottom portion of lock mechanism 410 may spring in an inward motion across surface 406 such that the end position causes the lock mechanism to sit on top of surface 406, thus preventing the valve from closing.

The terminology used herein is for the purpose of describing particular embodiments only and is not intended to be limiting to the invention. As used herein, the singular forms "a", "an" and "the" are intended to include the plural forms as well, unless the context clearly indicates otherwise.

Having described preferred embodiments of a filter switch assembly (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

Figure 5:
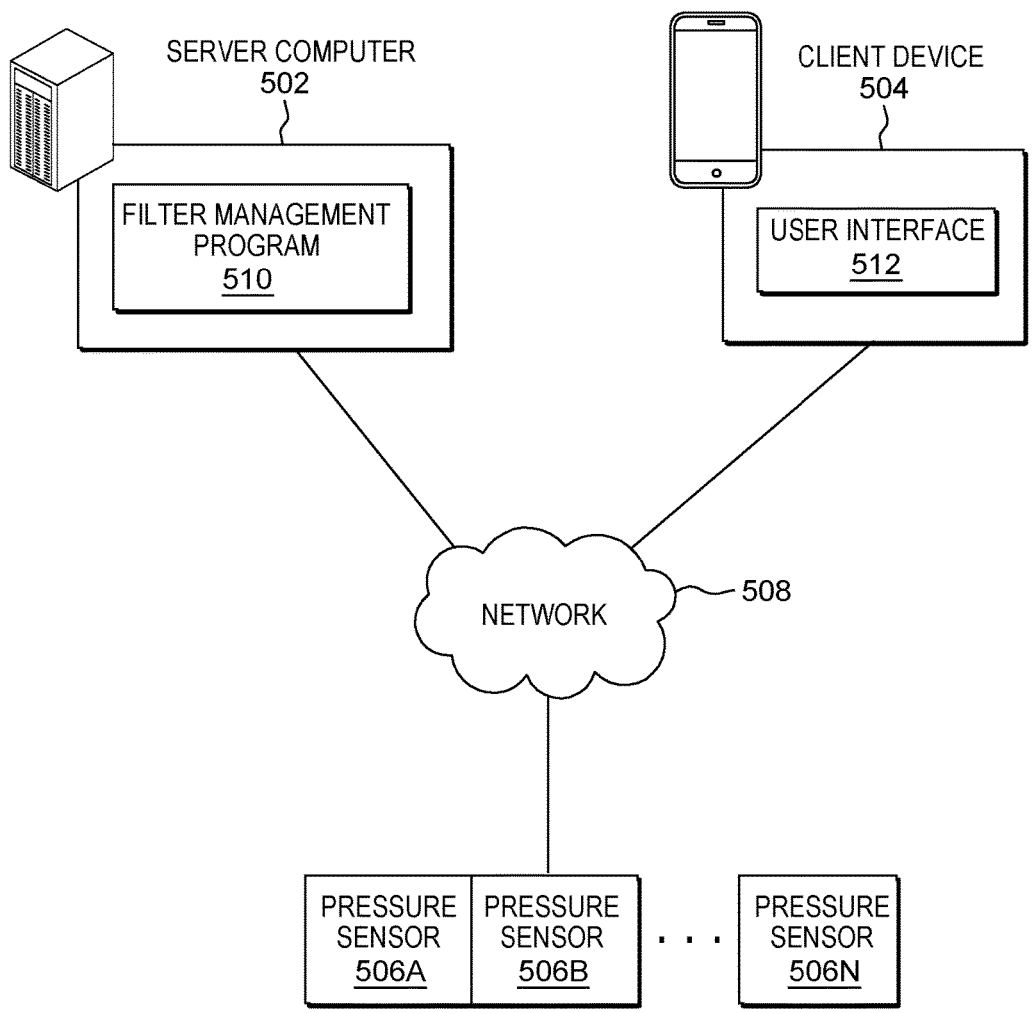
FIG. 5 is a functional block diagram illustrating a distributed data processing environment, in an embodiment in accordance with the present invention.

FIG. 5 is a functional block diagram illustrating a distributed data processing environment, in an embodiment in accordance with the present invention. The distributed data processing environment includes server computer 502, client device 504, and pressure sensors 506A, 506B, and 506N, all interconnected over network 508.

Server computer 502 may be a desktop computer, a laptop computer, a tablet computer, a specialized computer server, a smartphone, or any other computer system known in the art. In certain embodiments, server computer 502 represents a computer system utilizing clustered computers and components that act as a single pool of seamless resources when accessed through network 508, as is common in data centers and with cloud computing applications. In general, server computer 502 is representative of any programmable electronic device or combination of programmable electronic devices capable of executing machine-readable program instructions and communicating with other computer devices via a network. In this embodiment, server computer 502 includes filter management program 510 accessible by client device 504 and any other electronic devices not illustrated in FIG. 5, via network 508.

Client device 504 may be a laptop computer, tablet computer, netbook computer, personal computer (PC), personal digital assistant (PDA), smart phone, wearable device (e.g., smart watch, personal fitness device, personal safety device), or any programmable computer system known in the art with an interactive display. Client device 504 includes user interface 512 and may include a client based filter management program 510, not illustrated in FIG. 5. In general, client device 504 is representative of any programmable electronic device or combination of programmable electronic devices capable of executing machine-readable program instructions and communicating with users of other electronic devices via network 508. Client device 504 may include components, as depicted and described in further detail with respect to FIG. 7, in accordance with embodiments of the present invention.

Client device 504 includes filter management program 510 for managing filters in a filter assembly for processing liquid in a cooling system. Filter management program 510 has the ability to determine flow is passing through a first particle filter in a filter assembly and determines whether the pressure exceeds a pressure threshold at the first particle filter. In the event filter management program 510 determines the pressure exceeds the pressure threshold at the first particle filter, filter management program 510 sends a pressure over threshold at the first particle filter warning to client device 504. Filter management program 510 opens flow to a second particle filter in the filter assembly and determines flow is passing through the second particle filter. Filter management program 510 determines whether the pressure exceeds a pressure threshold at the second particle filter and in the event filter management program 510 determines the pressure exceeds the pressure threshold at the second particle filter, filter management program 510 sends a pressure over threshold at the second particle filter warning to client device 504. Filter management program 510 opens flow to an $N^{th}$ particle filter in the filter assembly, where the $N^{th}$ particle filter represents any additional particle filter in parallel with the first and second particle filter of the filter assembly.

Pressure sensors 506A, 506B, and 506N send pressure readings (e.g., 15 N/m$^2$) to filter management program 510 for various locations in a filter assembly. Filter management program 510 utilizes pressure sensors 506A, 506B, and 506N to determine when flow is passing through a particular particle filter and to determine whether the pressure exceed a pressure threshold at a particular particle filter. For example, pressure sensor 506A can be associated with a first particle filter, where pressure sensor 506A is located on a valve that dictates flow to a second particle filter. If the pressure at pressure sensor 506A exceeds a pressure threshold, filter management program 510 opens the valve to allow flow to the second particle filter. Pressure sensor 506B can be associated with the second particle filter, where pressure sensor 506B is located on a valve that dictates flow to a third particle filter. Pressure sensor 506N represents an additional pressure sensor that is located on a valve that dictates flow to an $N^{th}$ particle filter in the filter assembly.

Client device 504 also includes user interface (UI) 512 and various programs (not shown). Examples of the various programs on client device 504 include: a web browser, an e-mail client, security software (e.g., a firewall program, a geo-locating program, an encryption program, etc.), an instant messaging (IM) application (app), and a communication (e.g., phone) application. In an example, a user of client device 104 can interact with user interface 512, such as a touch screen (e.g., display) that performs both input to a graphical user interface (GUI) and as an output device (e.g., a display) presenting a plurality of icons associated with software applications or images depicting the executing software application. Optionally, a software application (e.g., a web browser) can generate user interface 512 operating within the GUI of client device 504. User interface 512 accepts input from a plurality of input/output (I/O) devices including, but not limited to, a tactile sensor interface (e.g., a touch screen, a touchpad) referred to as a multi-touch display. An I/O device interfacing with user interface 512 may be connected to client device 504, which may operate utilizing wired (e.g., USB port) or wireless network communications (e.g., infrared, NFC, etc.).

In general, network 508 can be any combination of connections and protocols that will support communications among server computer 502, client device 504, and pressure sensors 506A, 506B, and 506N. Network 508 can include, for example, a local area network (LAN), a wide area network (WAN), such as the internet, a cellular network, or any combination of the preceding, and can further include wired, wireless, and/or fiber optic connections. In one embodiment, filter management program 510 can be a web service accessible via network 508 to a user of client device 504. In another embodiment, filter management program 510 may be operated directly by a user of server computer 502.

Figure 6:
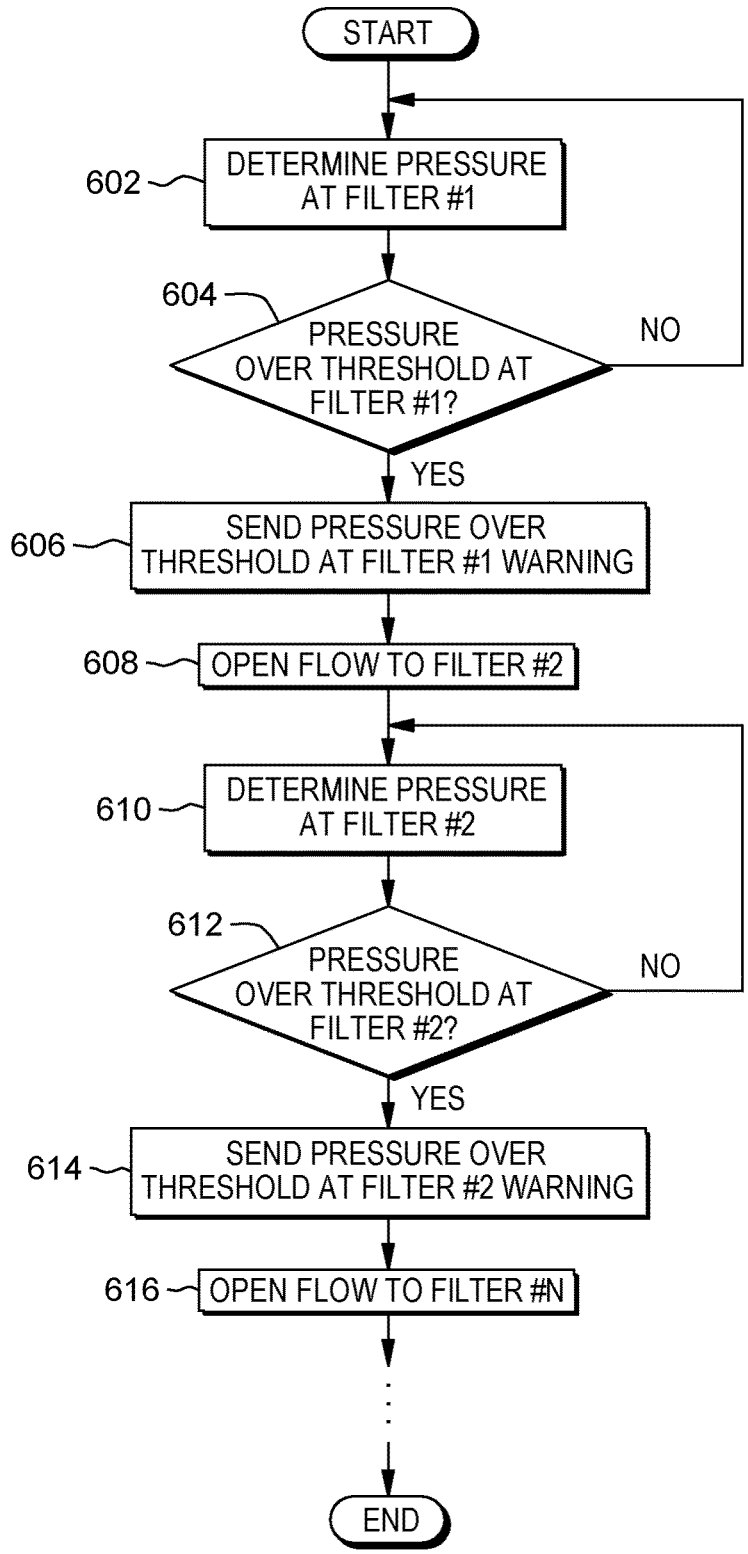
FIG. 6 is a flowchart depicting operational steps of a filter management program for a valve based filter switch assembly, in accordance with one embodiment of the present invention.

FIG. 6 is a flowchart depicting operational steps of filter management program 510 for a valve based filter switch assembly, in accordance with one embodiment of the present invention.

Filter management program 510 determines a pressure measurement at a first filter (602). In this embodiment, filter management program 510 determines flow is passing through the first filter in a filter assembly by receiving a pressure value from a pressure sensor associated with the first filter. Filter management program 510 utilizes a range of pressure values for determining that flow is passing through a first filter. For example, if filter management program 510 receives pressure readings from the pressure sensor for the first filter within the range of 1 N/m$^2$ to 15 N/m$^2$, filter management program 510 determines flow is passing through the first filter, where the first filter is processing content (e.g., liquid) without an obstruction at the first filter. In one embodiment, filter management program 510 monitors the pressure values in user defined intervals (e.g., 10 seconds).

Filter management program 510 determines whether the pressure exceeds a threshold at the first filter (604). The threshold represents a pressure threshold value (e.g., 15 N/m2), where filter management program 510 determines whether a current pressure reading at the first filter exceeds the pressure threshold value. In this embodiment, filter management program 510 determines whether pressure readings exceeds a pressure threshold of 15 N/m$^2$, where the operating range for the pressure at the first filter is 1 N/m$^2$ to 15 N/m$^2$. In the event filter management program 510 determines the pressure exceeds the threshold at the first filter ("yes" branch, 604), filter management program 510 sends a pressure over threshold warning at the first filter warning (606). In the event filter management program 510 determines the pressure does not exceed the threshold at the first filter ("no" branch, 604), filter management program 510 reverts back to determining a pressure measurement at the first filter (602).

Filter management program 510 sends a pressure over threshold at the first filter warning (606). In this embodiment, filter management program 510 sends a pressure over threshold at the first filter warning to a client device associated with a user servicing the filter assembly. The warning can include the pressure threshold value, the pressure value that exceeded the pressure threshold value, and an option to open flow to a second filter in the filter assembly, where opening flow to the second filter includes opening an electronically operated valve. In another embodiment, filter management program 510 operates in an autonomous manner, where filter management program 510 proceeds with opening flow to a second filter (608) subsequent to determining the pressure exceeds the threshold at the first filter. The autonomous operation of filter management program 510 allows for the opening of flow to the second filter without sending the pressure over threshold the first filter warning or waiting for an input from a user servicing the filter assembly to open flow to the second filter.

Filter management program 510 opens flow to a second filter (608). In this embodiment, filter management program 510 opens flow to a second filter by opening an electronically controlled valve that allows liquid flow to the second filter, along with the first filter.

Filter management program 510 determines a pressure measurement at the second filter (610). In this embodiment, filter management program 510 determines flow is passing through the second filter in a filter assembly by receiving a pressure value from a pressure sensor associated with the second filter. Filter management program 510 utilizes a range of pressure values for determining that flow is passing through a second filter. However, the range of pressure values for determining that flow is passing through the second filter may be different the range of pressure valued for the first filter. In one embodiment, filter management program 510 monitors the pressure values for the second filter in user defined intervals different from the first filter, where the intervals are shorter for the second filter compared with the first filter (e.g., 5 seconds vs. 10 seconds).

Filter management program 510 determines whether the pressure exceeds a threshold at the second filter (612). The threshold represents a pressure threshold value, where filter management program 510 determines whether a current pressure reading at the second filter exceeds the pressure threshold value. In this embodiment, filter management program 510 utilizes a lower pressure threshold for the second filter than the first filter. In another embodiment, filter management program 510 utilizes a greater pressure threshold for the second filter than the first filter. In the event filter management program 510 determines the pressure exceeds the threshold at the second filter ("yes" branch, 612), filter management program 510 sends a pressure over threshold warning at the second filter warning (614). In the event filter management program 510 determines the pressure does not exceed the threshold at the first filter ("no" branch, 612), filter management program 510 reverts back to determining a pressure measurement at the second filter (610).

Filter management program 510 sends a pressure over threshold at the second filter warning (614). In this embodiment, filter management program 510 sends a pressure over threshold at the second filter warning to a client device associated with a user servicing the filter assembly. The warning can include the pressure threshold value, the pressure value that exceeded the pressure threshold value, and an option to open flow to a $N^{th}$ filter in the filter assembly, where opening flow to the $N^{th}$ filter includes opening an electronically operated valve. In another embodiment, filter management program 510 operates in an autonomous manner, where filter management program 510 proceeds with opening flow to a $N^{th}$ filter (616) subsequent to determining the pressure exceeds the threshold at the second filter. The autonomous operation of filter management program 510 allows for the opening of flow to the $N^{th}$ filter without sending the pressure over threshold the second filter warning or waiting for an input from a user servicing the filter assembly to open flow to the $N^{th}$ filter. In another embodiment, filter management program 510 sends a pressure over threshold at the second filter warning and for any subsequent filter experiencing a pressure over threshold but allows for the semi-autonomous operations by not sending a pressure over threshold at the first filter warning.

Filter management program 510 opens flow to an $N^{th}$ filter (616). In this embodiment, filter management program 510 opens flow to an $N^{th}$ filter by opening an electronically controlled valve that allows liquid flow to the, along with any other filters in parallel which were already receiving liquid flow (i.e., the first and second filter). As previously discussed, the $N^{th}$ filter represents any additional particle filter in parallel with the first and second particle filter of the filter assembly.

Figure 7:
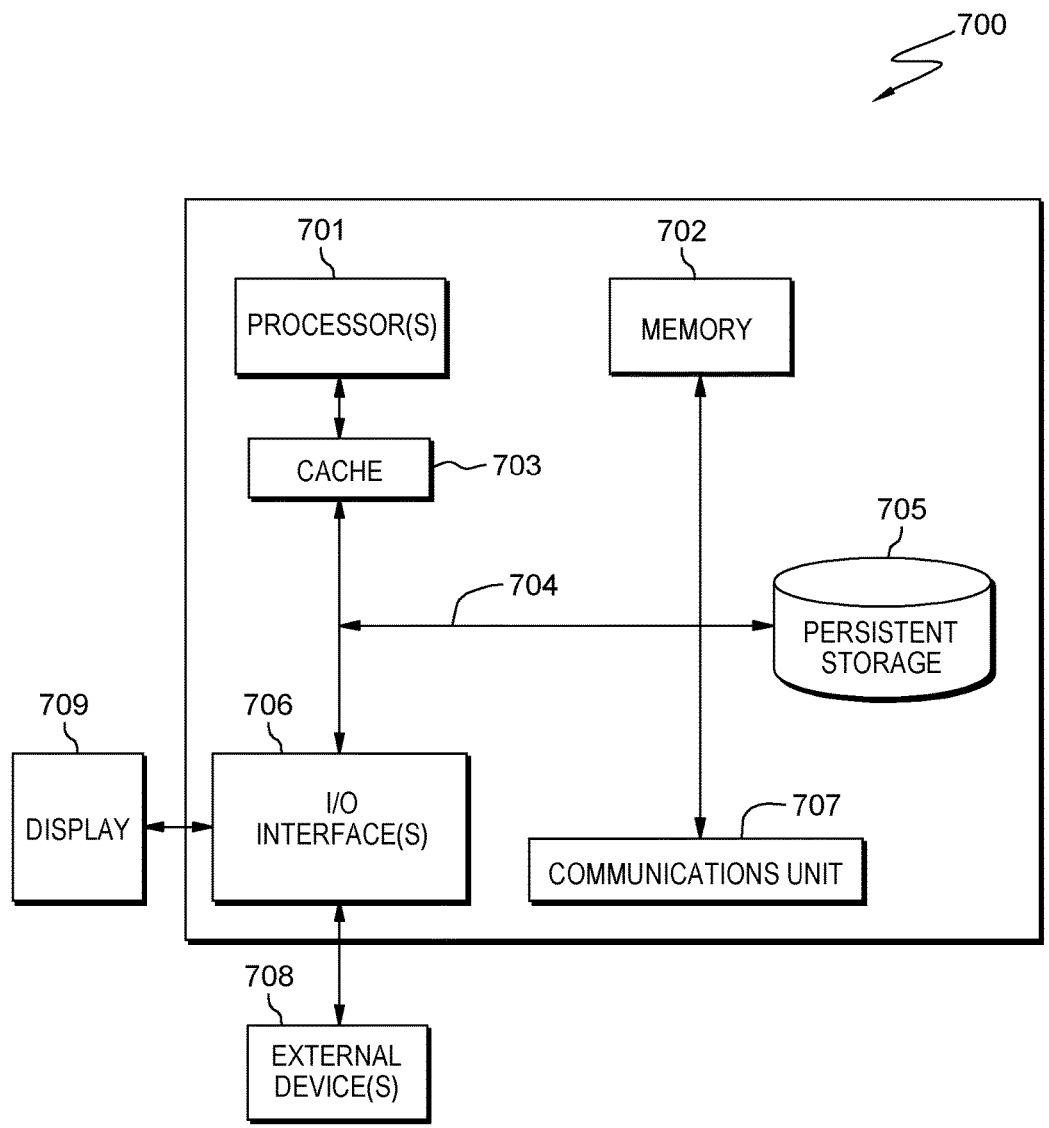
FIG. 7 depicts a block diagram of components of a computer system, such as the computer server of FIG. 5, in an embodiment in accordance with the present invention.

FIG. 7 depicts computer system 700, where server computer 502 and client device 504 are each an example of a system that includes filter management program 510. The computer system includes processors 701, cache 703, memory 702, persistent storage 705, communications unit 707, input/output (I/O) interface(s) 706 and communications fabric 704. Communications fabric 704 provides communications between cache 703, memory 702, persistent storage 705, communications unit 707, and input/output (I/O) interface(s) 706. Communications fabric 704 can be implemented with any architecture designed for passing data and/or control information between processors (such as microprocessors, communications and network processors, etc.), system memory, peripheral devices, and any other hardware components within a system. For example, communications fabric 704 can be implemented with one or more buses or a crossbar switch.

Memory 702 and persistent storage 705 are computer readable storage media. In this embodiment, memory 702 includes random access memory (RAM). In general, memory 702 can include any suitable volatile or non-volatile computer readable storage media. Cache 703 is a fast memory that enhances the performance of processors 701 by holding recently accessed data, and data near recently accessed data, from memory 702.

Program instructions and data used to practice embodiments of the present invention may be stored in persistent storage 705 and in memory 702 for execution by one or more of the respective processors 701 via cache 703. In an embodiment, persistent storage 705 includes a magnetic hard disk drive. Alternatively, or in addition to a magnetic hard disk drive, persistent storage 705 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 705 may also be removable. For example, a removable hard drive may be used for persistent storage 705. Other examples include optical and magnetic disks, thumb drives, and smart cards that are inserted into a drive for transfer onto another computer readable storage medium that is also part of persistent storage 705.

Communications unit 707, in these examples, provides for communications with other data processing systems or devices. In these examples, communications unit 707 includes one or more network interface cards. Communications unit 707 may provide communications through the use of either or both physical and wireless communications links. Program instructions and data used to practice embodiments of the present invention may be downloaded to persistent storage 705 through communications unit 707.

I/O interface(s) 706 allows for input and output of data with other devices that may be connected to each computer system. For example, I/O interface 706 may provide a connection to external devices 708 such as a keyboard, keypad, a touch screen, and/or some other suitable input device. External devices 708 can also include portable computer readable storage media such as, for example, thumb drives, portable optical or magnetic disks, and memory cards. Software and data used to practice embodiments of the present invention can be stored on such portable computer readable storage media and can be loaded onto persistent storage 705 via I/O interface(s) 706. I/O interface(s) 706 also connect to display 709.

Display 709 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. An apparatus for a switchable filter assembly, the apparatus comprising:
    a switchable filter assembly includes a first conduit, a second conduit, a third conduit, and a damper conduit;
    the first conduit coupled to the second and the third conduit, wherein a liquid has the ability to flow through the first conduit to the second conduit and the third conduit, wherein the second conduit and the third conduit are arranged in parallel;
    a first assembly inside the first conduit, such that a position of the first assembly determines an amount of liquid flowing through the first conduit to the third conduit;
        wherein the first assembly includes a first structure, wherein the first structure is a pressure dependent lockable valve and prevents the liquid from passing through the first conduit to the third conduit;
        wherein the position of the first structure of the first assembly is dependent on a pressure of the liquid flowing from the first conduit to the second conduit;
    a first particle filter coupled to the second conduit, wherein the second conduit allows for liquid to flow towards the first particle filter, wherein the first particle filter introduces a first chemical treatment for preventing corrosion in a cooling system;
    a second particle filter coupled to the third conduit, wherein the third conduit allows for liquid to flow towards the second particle filter, wherein the second particle filter introduces a second chemical treatment for preventing an obstruction in the cooling system; and
    the damper conduit perpendicularly coupled to the first conduit for pressure spike prevention at a first end of the damper conduit opposite a closed second end of the damper conduit, wherein a height of the second end of the damper conduit is greater than a height of the pressure dependent lockable valve located in the first conduit.

2. The apparatus of claim 1, wherein:
    the first assembly is capable of sliding inside the first conduit, wherein the first assembly includes a compressible member coupled to the first structure; and
    an amount of compression of the compressible member coupled to the first structure determines the position of the first structure of the first assembly.

3. The apparatus of claim 1, wherein the first structure is coupled to a first motor, wherein the first motor controls the position of the first structure of the first assembly.

4. The apparatus of claim 1, wherein a mesh filter size of the first particle filter is smaller than a mesh filter size of the second particle filter.

5. The apparatus of claim 1, further comprising:
    a fourth conduit coupled to the first particle filter, wherein the liquid with the first chemical treatment flows from the first particle filter to the fourth conduit;
    a fifth conduit coupled to the second particle filter, wherein the liquid with the second chemical treatment flows from the second particle filter to the fifth conduit; and
    an outlet conduit coupled to the fourth conduit and the fifth conduit, wherein the first chemical treatment and the second chemical treatment flow through the outlet conduit and into the cooling system.

* * * * *